United States Patent
Itakura et al.

(10) Patent No.: US 6,646,319 B2
(45) Date of Patent: Nov. 11, 2003

(54) SEMICONDUCTOR DEVICE HAVING ISOLATING REGION FOR SUPPRESSING ELECTRICAL NOISE

(75) Inventors: Hirokazu Itakura, Hazu-gun (JP); Hiroyuki Ban, Hazu-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/175,306

(22) Filed: Jun. 20, 2002

(65) Prior Publication Data

US 2003/0001224 A1 Jan. 2, 2003

(30) Foreign Application Priority Data

Jun. 29, 2001 (JP) .......................................... 2001-199128

(51) Int. Cl.⁷ .............................................. H01L 29/00
(52) U.S. Cl. ...................... 257/500; 257/501; 257/503; 257/505; 257/506; 257/508; 257/513; 257/520
(58) Field of Search ................................. 257/500, 501, 257/505, 506, 508, 513, 520, 524, 503

(56) References Cited

U.S. PATENT DOCUMENTS

| | | |
|---|---|---|
| 5,449,946 A | 9/1995 | Sakakibara et al. |
| 5,480,832 A | 1/1996 | Miura et al. |
| 5,557,134 A | 9/1996 | Sugisaka et al. |
| 5,559,356 A | 9/1996 | Yukawa |
| 5,644,157 A | 7/1997 | Iida et al. |
| 5,793,060 A | 8/1998 | Morikawa |
| 6,104,078 A | 8/2000 | Iida et al. |
| 6,429,502 B1 * | 8/2002 | Librizzi et al. ............. 257/510 |
| 2002/0014639 A1 | 2/2002 | Imai et al. |

FOREIGN PATENT DOCUMENTS

| | | |
|---|---|---|
| JP | A-7-302914 | 11/1995 |
| JP | A-2000-208714 | 7/2000 |
| JP | A-2001-15589 | 1/2001 |
| JP | A-2002-33382 | 1/2002 |

* cited by examiner

Primary Examiner—Thien Tran
(74) Attorney, Agent, or Firm—Posz & Bethards, PLC

(57) ABSTRACT

A semiconductor device includes an output power device, which generates an electrical noise, and an on-chip circuit, to which the noise is transmitted. The output power device is surrounded by two isolating regions. The area between the two isolating regions is electrically connected to a field ground area by a first wiring line. The field ground area is electrically connected to a point of contact, which has ground potential. The area between the outer isolating region of the two isolating regions and another isolating region around the on-chip circuit is also electrically connected to the field ground area by a second wiring line. The first and second wiring lines are separated from each other. The electrical noise is transmitted to the field ground area and released to the point of contact. Therefore, the noise is attenuated and the transmission of the noise to the on-chip circuit is suppressed.

20 Claims, 10 Drawing Sheets

SEMICONDUCTOR DEVICE HAVING ISOLATING REGION FOR SUPPRESSING ELECTRICAL NOISE

CROSS REFERENCE TO RELATED APPLICATION

This application is based on and incorporates herein by reference Japanese Patent Application. No. 2001-199128 filed on Jun. 29, 2001.

BACKGROUND OF THE INVENTION

1. Field of the Invention

The present invention relates to a semiconductor device, a circuit in which is isolated and insulated by an isolating region.

2. Description of the Related Art

Figure 10A:
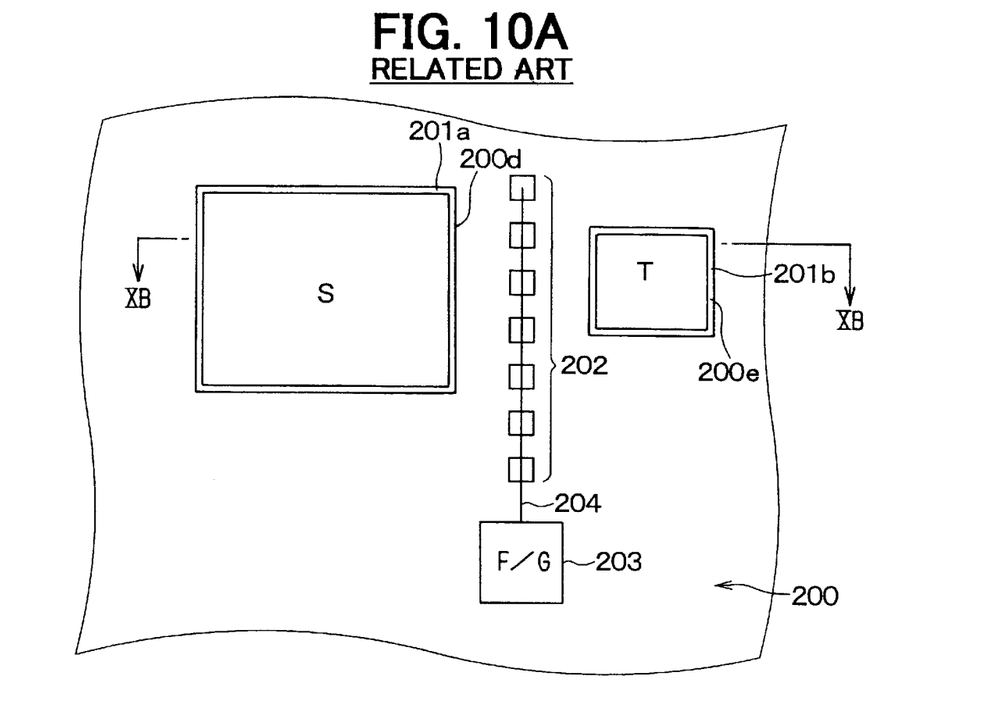
FIG. 10A is a schematic plan view of the proposed semiconductor device.
Figure 10B:
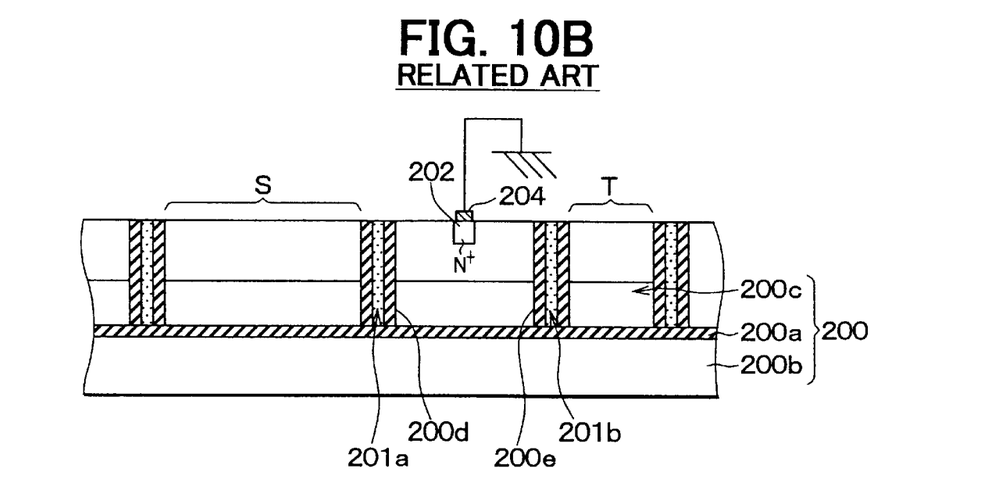
FIG. 10B is the cross-sectional view of the proposed semiconductor device taken along the line XB—XB in FIG. 10A.

A semiconductor device shown in FIG. 10A is proposed. In the proposed device, an SOI substrate 200 includes a base silicon layer 200b, an active silicon layer 200c, and an insulating layer 200a that separates the silicon layers 200b, 200c, as shown in FIG. 10B. The active silicon layer 200c includes a power device area S, where an output power device such as a UPDRAIN or an LDMOS is located, and an on-chip circuit area T, where an on-chip circuit that generates reference voltage is located. The power device area S is surrounded by a trench 200d and an insulating material 201a, which is located in the trench 200d. The on-chip circuit area T is surrounded by another trench 200e and another insulating material 201b, which is located in the trench 200e surrounding the on-chip circuit area T.

The active silicon layer 200c includes a plurality of $n^+$-type contact regions 202 between the power device area S and the on-chip circuit area T to fix the potential, as shown in FIGS. 10A and 10B.

The active silicon layer 200c also includes a field ground (F/G) area 203. The field ground area 203 and each $n^+$-type contact region 202 are electrically connected by a wiring line 204.

In the proposed device, the output power device and the on-chip circuit are insulated and electrically separated from each other by the insulating layer 200a and the insulating materials 201a, 201b, as shown in FIG. 10B. However, when the output power device is switched with relatively high frequency, an electrical noise is generated due to the variation in counter-electromotive force or load current generated by inductive load (L load) in the output power device. The noise can prevent the on-chip circuit from functioning properly. The influence of the noise can be attenuated by increasing the distance between the output power device and the on-chip circuit. However, the size of the SOI substrate 200 increases.

SUMMARY OF THE INVENTION

The present invention has been made in view of the above aspects with an object to provide a semiconductor device having a structure, with which the influence of an electrical noise, which is generated by an output power device, on an on-chip circuit is suppressed.

In the present invention, the output power device is surrounded by two isolating regions. The area between the two isolating regions is electrically connected to a field ground area by a first wiring line. The field ground area is electrically connected to a point of contact, which has ground potential. The area between the outer isolating region of the two isolating regions and another isolating region around the on-chip circuit is also electrically connected to the field ground area by a second wiring line. The first and second wiring lines are separated from each other. The electrical noise, which is generated by the output power device, is transmitted to the field ground area and released to the point of contact. Therefore, the noise is attenuated and the transmission of the noise to the on-chip circuit is suppressed.

BRIEF DESCRIPTION OF THE DRAWINGS

The above and other objects, features and advantages of the present invention will become more apparent from the following detailed description made with reference to the accompanying drawings.

In the drawings.

DETAILED DESCRIPTION OF THE PREFERRED EMBODIMENTS

The present invention will be described in detail with reference to various embodiments.

First Embodiment

Figure 1A:
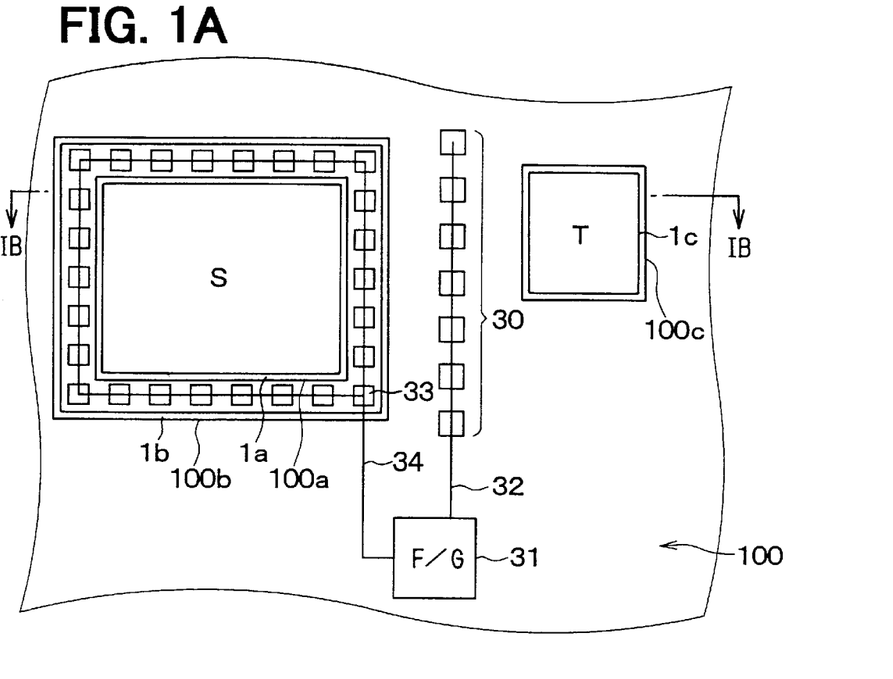
FIG. 1A is a schematic plan view of a semiconductor device according to the first embodiment of the present invention.
Figure 1B:
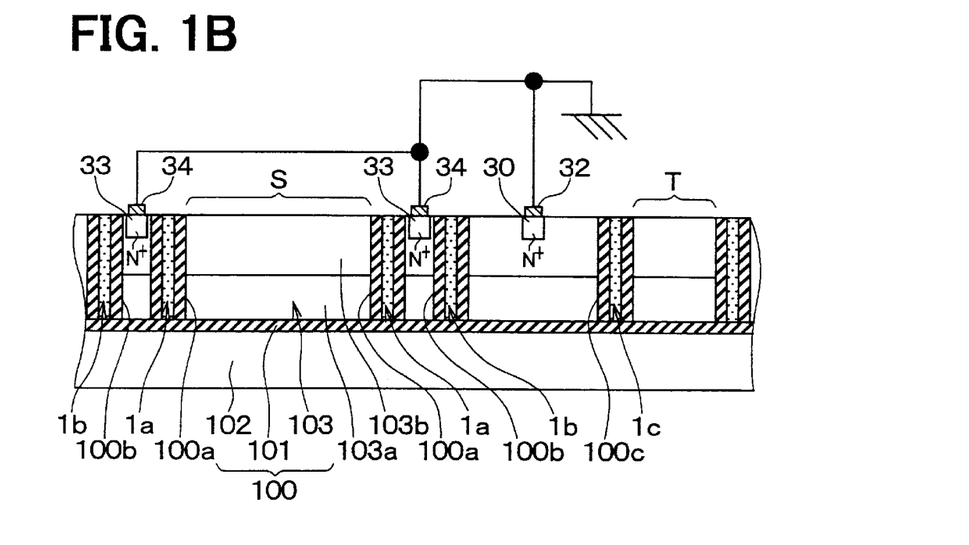
FIG. 1B is a schematic cross-sectional view of the semiconductor device taken along the line IB—IB in FIG. 1A.

As shown in FIGS. 1A and 1B, in a semiconductor device according to the first embodiment, an SOI substrate 100 includes a base silicon layer 102, an active silicon layer 103, and an insulating layer 101 that separates the silicon layers 102, 103. The active silicon layer 103 includes an $n^+$-type layer 103a and an $n^-$-type well layer 103b. The active silicon layer 103 includes a power device area S (first area), where an output power device such as a UPDRAIN or an LDMOS is located, and an on-chip circuit area T (second area), where an on-chip circuit that generates reference voltage is located.

Figure 2:
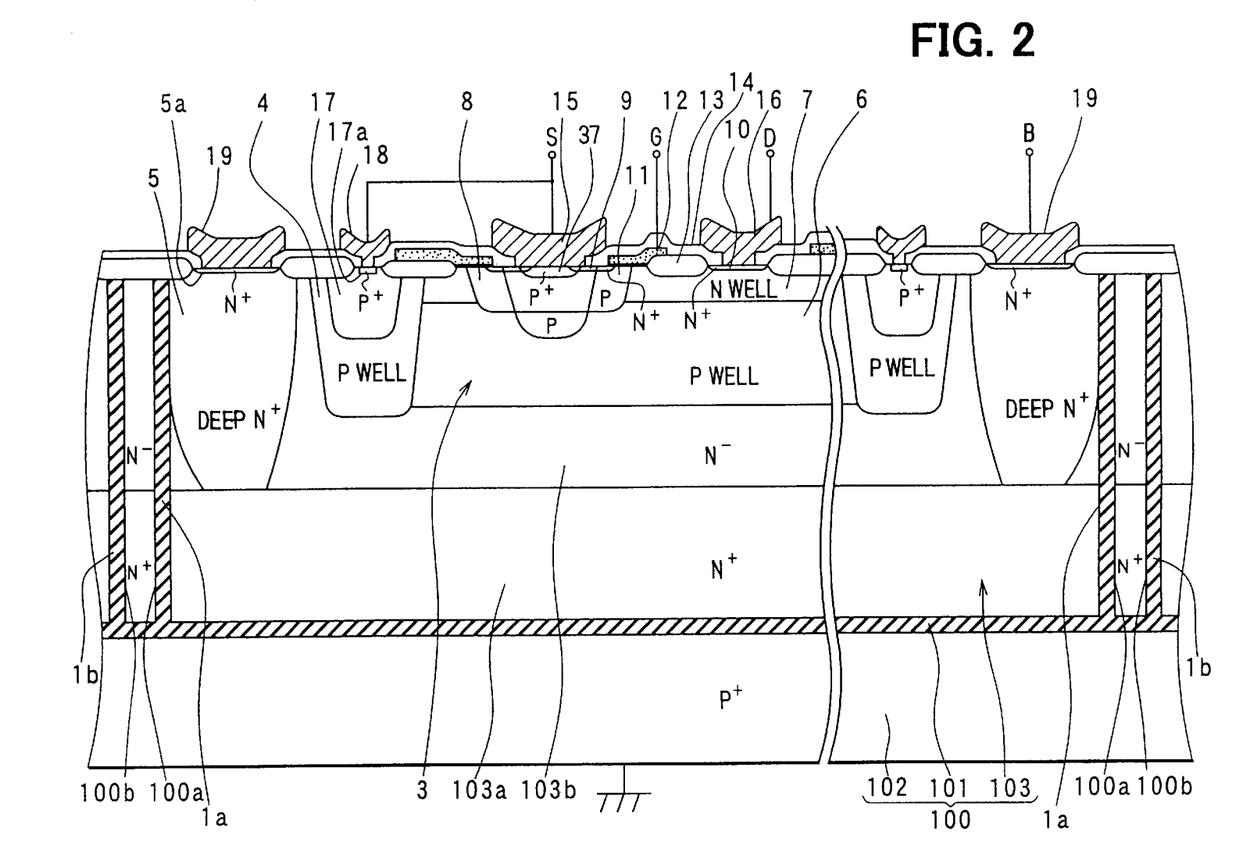
FIG. 2 is a detailed cross-sectional view of the area S where the output power device is located.

In the semiconductor device in FIGS. 1A and 1B, the output power device is an LDMOS 3, as shown in FIG. 2.

When the output power device is switched with relatively high frequency, an electrical noise is generated due to the variation in counter-electromotive force or load current generated by inductive load (L load) in the output power device. A first isolating region includes a first trench 100a and a first insulating material 1a, which is located in the first trench 100a. A second isolating region includes a second trench 100b and a second insulating material 1b, which is located in the second trench 100b. The power device area S is surrounded by the first and second isolating regions. The on-chip circuit area T is surrounded by a third isolating region, which includes a third trench 100c and a third insulating material 1c located in the third trench 100c.

As shown in FIG. 2, a p well region 4 is located around the LDMOS 3, and a deep $n^+$ region 5 is located around the p well region 4. A p well region 6 is located on the $n^-$-type well layer 103b of the active silicon layer 103. In a surface of the p well region 6, an n well region 7 and a channel p well region 8 are located. In a surface of the channel p well region 8, an $n^+$-type source region 9 is located. In a surface of the n well region 7, an $n^+$-type drain region 10 is located at a position separate from the channel p well region 8.

A channel region 11 is located in the surface of the channel p well region 8 between the $n^+$-type source region 9 and the n well region 7. On the channel region 11, a gate insulating film is located. On the gate insulating film, a gate electrode 12 is located. In FIG. 2, the gate electrode 12 is made of polycrystalline silicon and extended to a surface on a LOCOS oxide film 13, which is formed on the n well region 7. An interlayer insulating film 14 is located on the gate electrode 12 and the LOCOS oxide film 13. A source electrode 15 and a drain electrode 16 are respectively connected to the source region 9 and the drain region 10 through each contact hole in the interlayer insulating film 14. In the LDMOS 3, when a predetermined voltage is applied to the gate electrode 12, a current flows between the source region 9 and the drain region 10 through the channel region 11.

A $p^+$ region 37, which is adjacent to the source region 9 in the surface of the channel p well region 8, is for fixing the potential of the channel p well region 8 to that of the source electrode 15. The p well region 4 around the LDMOS 3 is in contact with the p well region 6 of the LDMOS 3. In a surface of the p well region 4, a base region 17 is located. In a surface of the base region 17, a contact $p^+$ region 17a is located. On a surface of the contact $p^+$ region 17a, an electrode 18 that is electrically connected to the source electrode 15 is located. The base region 17 and the p well region 4 around the LDMOS 3 are for surely fixing the potential of the p well region 6 of the LDMOS 3 to that of the source electrode 15.

As shown in FIG. 2, the deep $n^+$ region 5 is in contact with the first insulating material 1a, which is located in the first trench 100a. In a surface of the deep $n^+$ region 5, a contact $n^+$ region 5a is located. On a surface of the contact $n^+$ region 5a, a bottom electrode 19 is located. The deep $n^+$ region 5 is electrically connected to the bottom electrode 19 by the contact $n^+$ region 5a. When a counter-electromotive force is applied to the drain electrode 16, a current generated by the counter-electromotive force flows to the bottom electrode 19 through the active silicon layer 103 and the deep $n^+$ region 5.

The on-chip circuit includes a circuit such as a band-gap circuit, a charge-pump circuit, or a signal processing circuit. The on-chip circuit can malfunction if an external electric noise is applied. As shown in FIGS. 1A and 1B, the on-chip circuit is surrounded by the third isolating region, which includes the third trench 100c and the third insulating material 1c. In the semiconductor device in FIGS. 1A and 1B, the on-chip circuit includes a band-gap circuit having an NPN transistor shown in FIG. 3.

Figure 3:
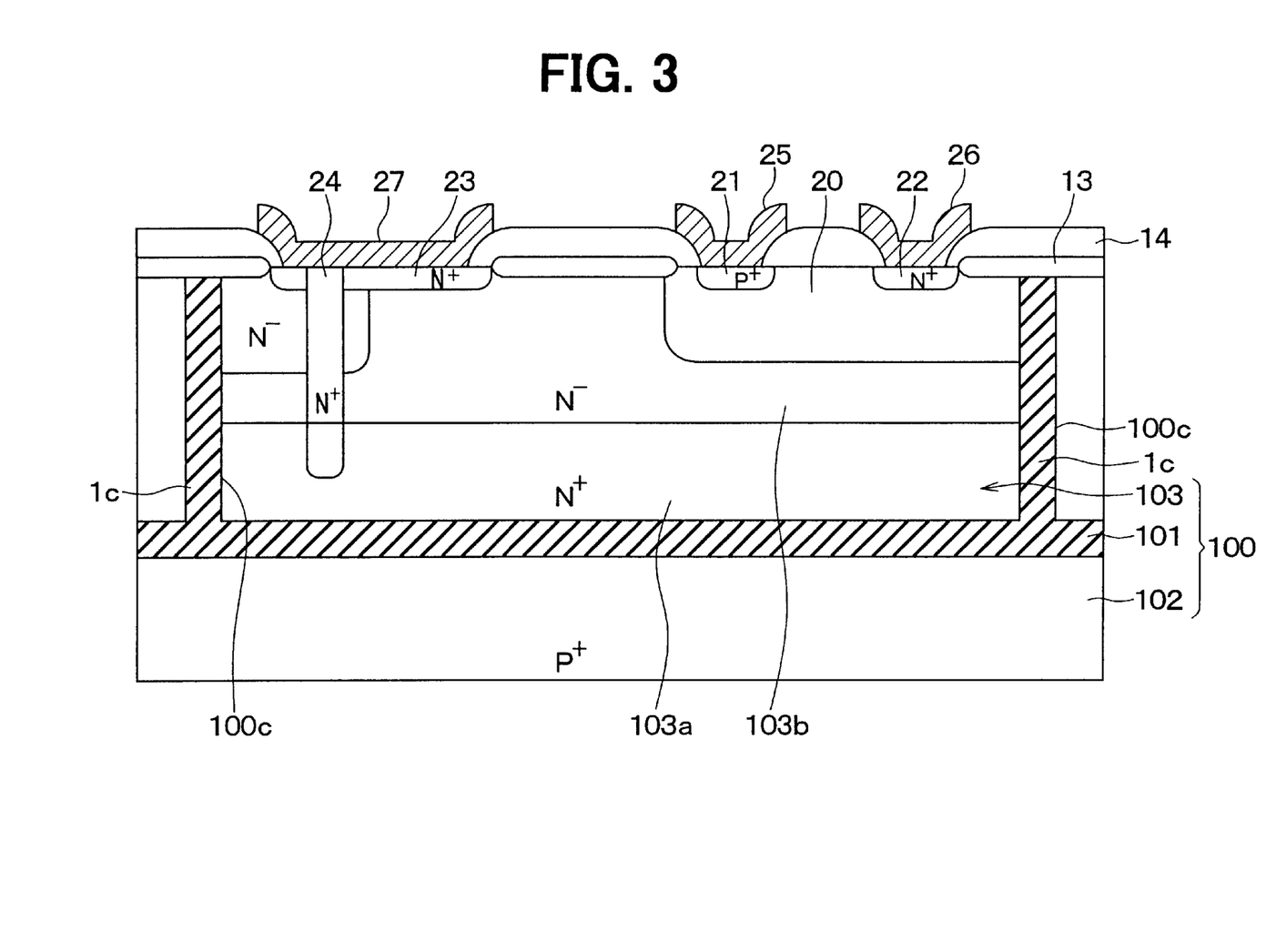
FIG. 3 is a detailed cross-sectional view of the area T where the on-chip circuit is located.

As shown in FIG. 3, the NPN transistor is located in a surface of the active silicon layer 103. A p-type base region 20 is located in a surface of the $n^-$-type well layer 103b of the active silicon layer 103. In a surface of the p-type base region 20, a $p^+$-type contact region 21 and an $n^+$-type emitter region 22 are located. In the surface of the $n^-$ well layer 103b, an $n^+$-type collector region 23 is located separately from the p-type base region 20. As shown in FIG. 3, another deep $n^+$ region 24 extends perpendicularly from a surface of the $n^+$-type collector region 23 to the $n^+$-type layer 103a through the $n^-$-type well layer 103b. A base electrode 25, an emitter electrode 26, and a collector electrode 27 are located on and electrically connected to the $p^+$-type contact region 21, the $n^+$-type emitter region 22, and the $n^+$-type collector region 23, respectively. Each electrode 25, 26, 27 is insulated from other regions by the LOCOS oxide film 13 and the interlayer insulating film 14.

The active silicon layer 103 includes a plurality of first $n^+$-type contact regions 30 (first contact region) in the area (third area) between the second and the third isolating regions, as shown in FIGS. 1A and 1B. The active silicon layer 103 also includes a plurality of second $n^+$-type contact regions 33 (second contact region) in the area (fourth area) between the first and the second isolating regions. The first and second $n^+$-type contact regions 30, 33 are for fixing the potentials of the third and fourth areas and have a higher impurity concentration than the $n^-$-type well layer 103b. The active silicon layer 103 also includes a field ground area 31. The field ground area 31 is electrically connected to a point of contact, which is located outside of the substrate 100 and has ground potential. The field ground area 31 and the second $n^+$-type contact regions 33 are electrically connected by a first wiring line 34. The field ground area 31 and the first $n^+$-type contact regions 30 are electrically connected by a second wiring line 32. Therefore, the potentials of the third and fourth areas are fixed to the ground potential. The first wiring line 34 and the second wiring line 32 are separated from each other and separately connected to the field ground area 31 to electrically separate the third and fourth areas, as shown in FIG. 1A.

Figure 4A:
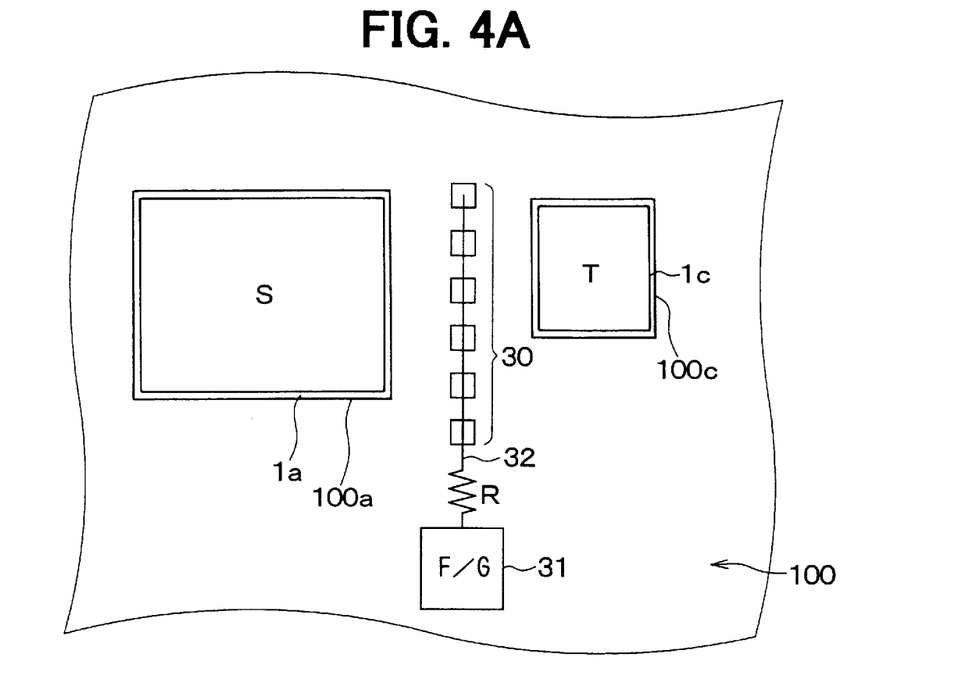
FIG. 4A is a schematic plan view of a reference semiconductor device used for studying the transmission of an electric noise.
Figure 4B:
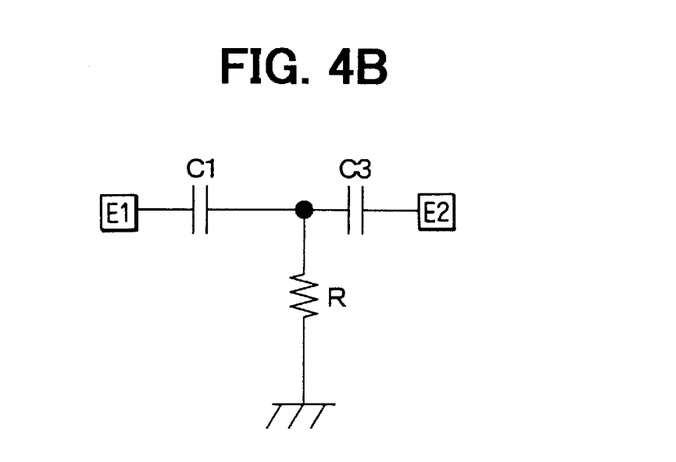
FIG. 4B is an equivalent circuit diagram for the parasitic circuit of the device in FIG. 4A.

The transmission of an electric noise from the output power device to the on-chip circuit will be described in detail below. A reference semiconductor device shown in FIG. 4A has substantially the same structure as the proposed device shown in FIGS. 10A and 10B. The parasitic circuit of the device in FIG. 4A is expressed by the equivalent circuit diagram shown in FIG. 4B. In FIG. 4B, a capacitor C1 has substantially the same capacitance as the parasitic capacitance of an isolating region, which is located around an output power device area S and includes a trench 100a and an insulating material 1a. Another capacitor C3 has substantially the same capacitance as the parasitic capacitance of another isolating region, which is located around an on-chip circuit area T and includes a trench 100c and an insulating material 1c. A resistor R has substantially the same resistance as the parasitic resistance of a wiring line 32.

Figure 5A:
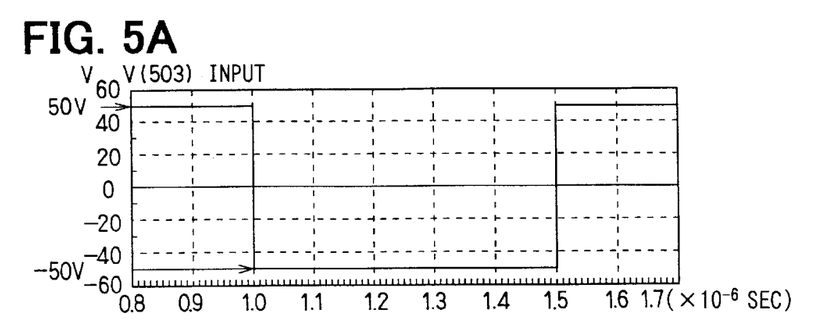
FIGS. 5A to 5D are wave form charts showing the electric noise and the outputs corresponding to the noise.
Figure 5B:
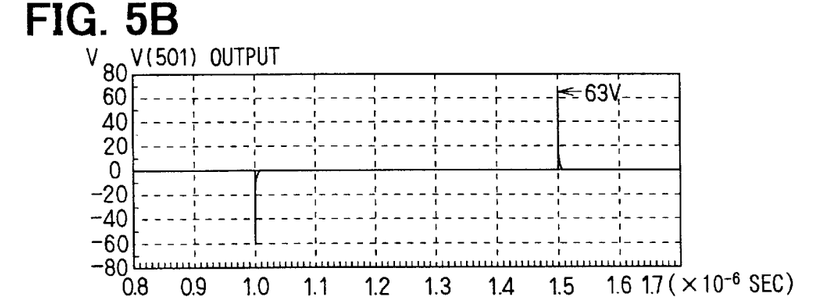

When a voltage wave form, the chart of which is shown in FIG. 5A, is inputted, as an electric noise generated by an output power device in the output power device area S, from an electrode E1 toward the capacitor C1, a corresponding voltage wave form, the chart of which is shown in FIG. 5B, is outputted from the capacitor C3 to another electrode E2.

In FIG. 5B, the maximum voltage is 63 V. The voltage wave form shown in FIG. 5B is substantially the same electric noise that is transmitted to the on-chip circuit. The greater the electric noise transmitted to the on-chip circuit, the greater the influence on the on-chip circuit.

Figure 5C:
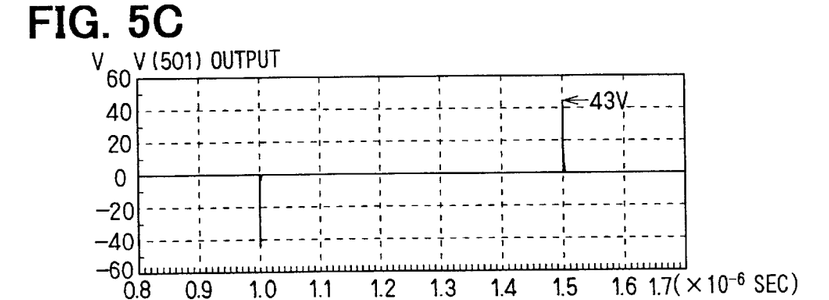
Figure 6A:
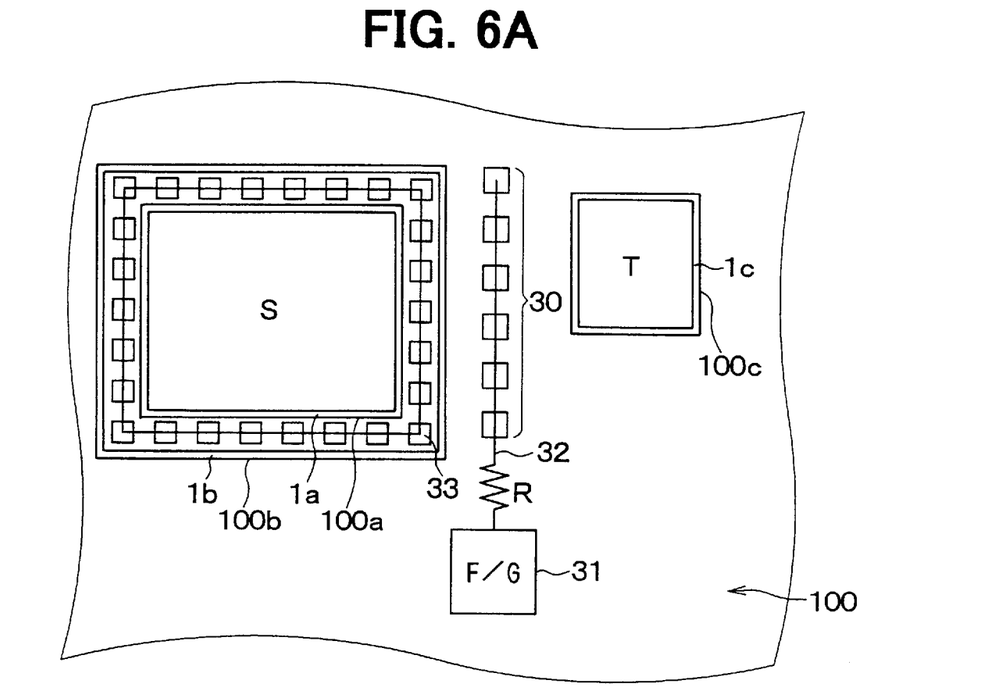
FIG. 6A is a schematic plan view of a tentative semiconductor device.
Figure 6B:
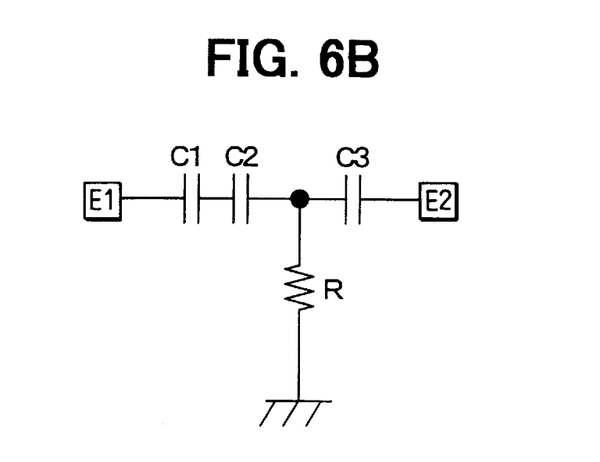
FIG. 6B is an equivalent circuit diagram for the parasitic circuit of the device in FIG. 6A.

A tentative semiconductor device shown in FIG. 6A includes another isolating region, which includes a trench 100b and an insulating material 1b, around the isolating region, which includes the trench 100a and the insulating material 1a. The area between the two isolating regions is electrically floating. The parasitic circuit of the device in FIG. 6A is expressed by the equivalent circuit diagram shown in FIG. 6B. In FIG. 6B, a capacitor C2 has substantially the same capacitance as the parasitic capacitance of the isolating region, which includes a trench 100b and an insulating material 1b. In the equivalent circuit diagram shown in FIG. 6B, the voltage wave form shown in FIG. 5C is outputted from the capacitor C3 to another electrode E2. In FIG. 5C, the maximum voltage is 43 V. Therefore, the electric noise that is transmitted to the on-chip circuit is lowered in comparison with the one in the reference semiconductor device shown in FIG. 4A, which has substantially the same structure as the proposed device shown in FIGS. 10A and 10B.

Figure 5D:
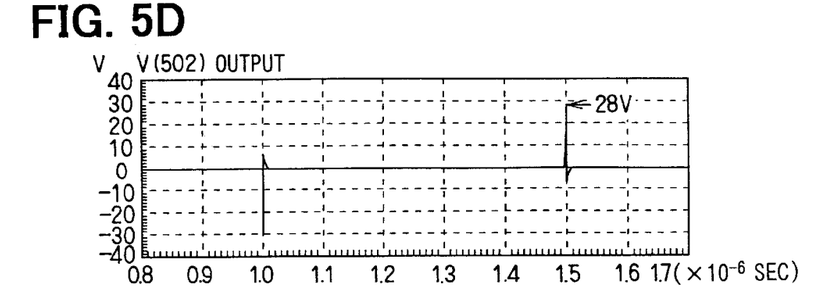
Figure 7A:
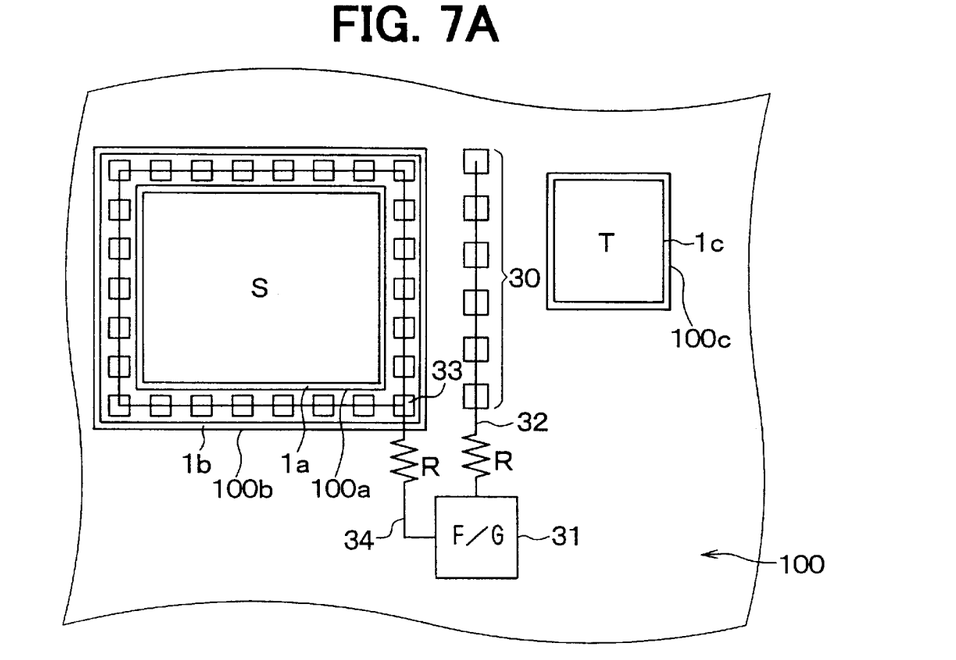
FIG. 7A is a schematic view of the same device as in FIG. 1A.
Figure 7B:
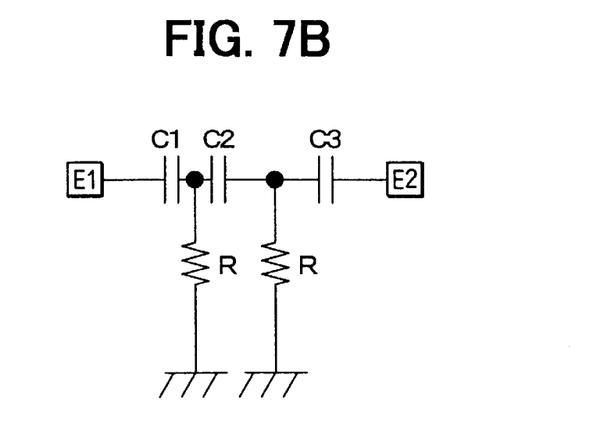
FIG. 7B is an equivalent circuit diagram for the parasitic circuit of the device in FIG. 7A.

A semiconductor device shown in FIG. 7A has substantially the same structure as the device shown in FIGS. 1A and 1B. The parasitic circuit of the device in FIG. 7A is expressed by the equivalent circuit diagram shown in FIG. 7B. In FIG. 7B, another resistor R, which is connected to a point of contact between the capacitors C1 and C2, has substantially the same resistance as the parasitic resistance of the wiring line 34. In the equivalent circuit diagram shown in FIG. 7B, the voltage wave form shown in FIG. 5D is outputted from the capacitor C3 to another electrode E2. In FIG. 5D, the maximum voltage is 28 V. Therefore, the electric noise that is transmitted to the on-chip circuit is preferably lowered in comparison with the one in the reference semiconductor device shown in FIG. 4A. In FIG. 7B, the wiring line between the capacitors C2 and C3 is equivalent to the third area. The wiring line between the capacitors C1 and C2 is equivalent to the fourth area. The point of contact between the capacitors C2 and C3 is equivalent to the first contact region. The point of contact between the capacitors C1 and C2 is equivalent to the second contact region.

Figure 8A:
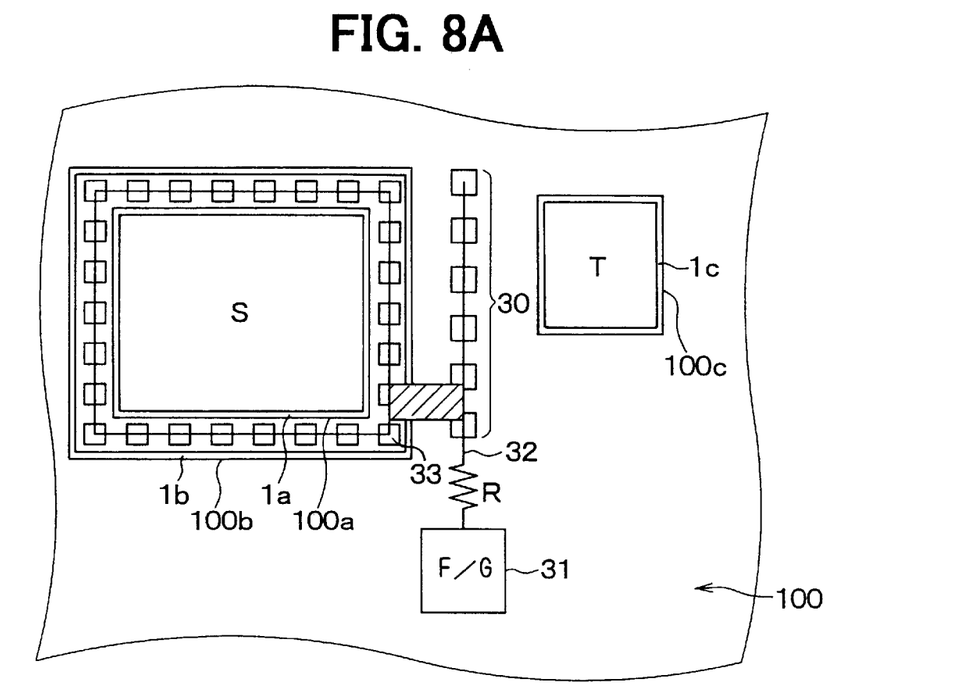
FIG. 8A is a partial plan view of another tentative semiconductor device.
Figure 8B:
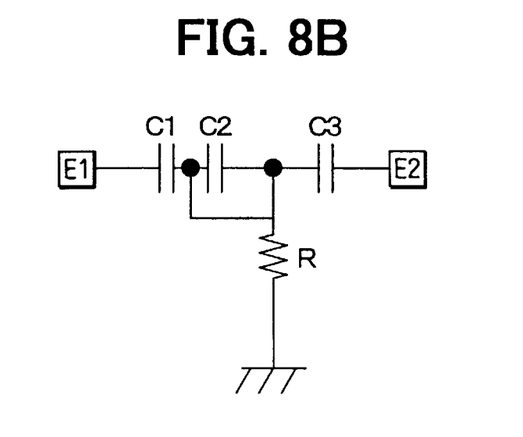
FIG. 8B is an equivalent circuit diagram for the parasitic circuit of the device in FIG. 8A.

In another reference semiconductor device shown in FIG. 8A, the fourth area is electrically connected to the third area, not directly connected to the field ground area 31 as the device in FIG. 7A. The parasitic circuit of the device in FIG. 8A is expressed by the equivalent circuit diagram shown in FIG. 8B. The equivalent circuit diagram shown in FIG. 8B is equivalent to that shown in FIG. 4B, so the electric noise that is transmitted to the on-chip circuit is substantially the same as the one in the reference semiconductor device shown in FIG. 4A. Thus, the fourth area needs to be electrically connected to the field ground area 31 separately from the wiring line 32, as shown in FIG. 7A.

The semiconductor device according to the first embodiment is manufactured in the same manner as for the proposed device. The only difference is that the first and second trenches 100a, 100b are formed, that the second $n^+$-type contact regions 33 are formed when the first $n^+$-type contact regions 30 are formed, and that the first wiring line 34 is formed when the second wiring line 32 is formed.

Second Embodiment

Figure 9A:
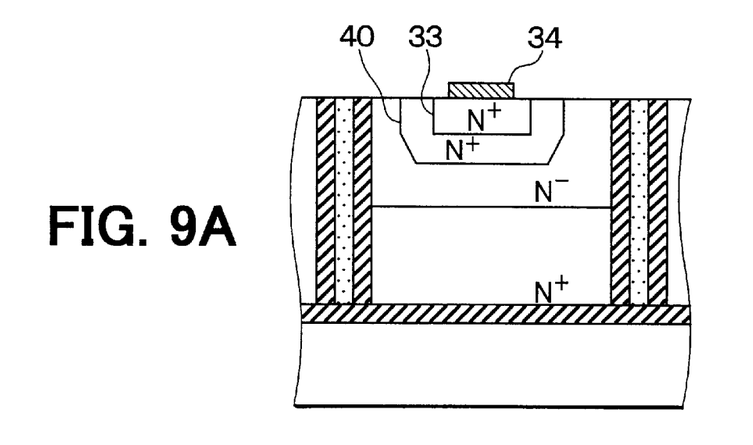
FIGS. 9A to 9C are cross-sectional views showing structural variations of the second contact region according to the second embodiment of the present invention.
Figure 9B:
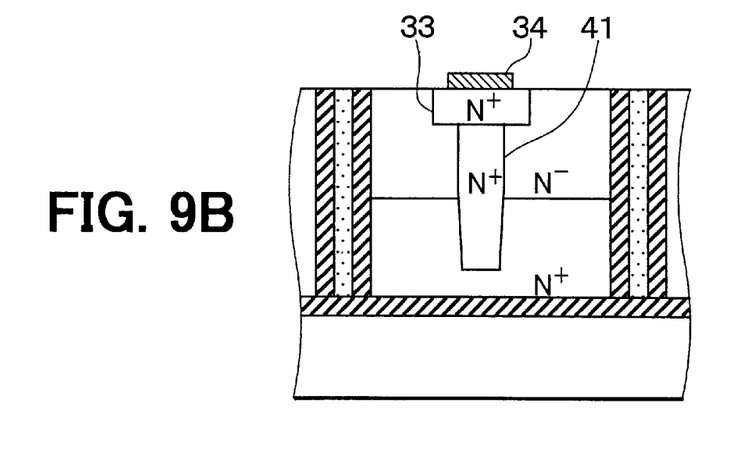
Figure 9C:
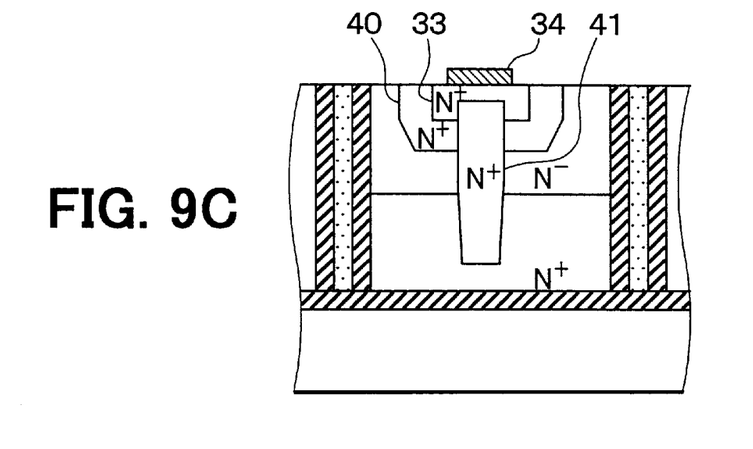

In the semiconductor device according to the first embodiment, the second contact region includes only the second $n^+$-type contact regions 33, as shown in FIG. 1B. In a semiconductor device according to the second embodiment, the second contact region includes the second $n^+$-type contact regions 33 (main contact region) and a plurality of $n^+$-type supplementary contact region 40, 41, (supplementary contact region). Each $n^+$-type supplementary contact region 40, 41 is connected to each second $n^+$-type contact region 33 to reduce the resistance at each second contact region, as shown in FIGS. 9A to 9C. Except for the supplementary contact regions 40, 41, the device according to the second embodiment has the same structure as the device in FIGS. 1A and 1B.

In a device, a part of which is shown in FIG. 9A, each supplementary contact region 40, which has an impurity concentration higher than the $n^-$-type well layer 103b, is located such that each second $n^+$-type contact region 33 is located in a surface of each supplementary contact region 40. The supplementary contact regions 40 are formed simultaneously, without an additional step, for example, when the $n^+$-type emitter region 22, which is doped region, shown in FIG. 3 is formed. In another device, a part of which is shown in FIG. 9B, each supplementary contact region 41, which has an impurity concentration higher than the $n^-$-type well layer 103b, extends from each second $n^+$-type contact region 33 to the $n^+$-type layer 103a. The supplementary contact regions 41 are formed simultaneously, without an additional step, for example, when the deep $n^+$ region 24, which is a doped region, shown in FIG. 3 is formed. In another device, a part of which is shown in FIG. 9C, the supplementary contact regions 40, 41 shown in FIGS. 9A and 9B are both used. With respect to the device, a part of which is shown in FIG. 9C, the supplementary contact regions 40, 41 are also formed without an additional step.

In the semiconductor devices according to the first and second embodiments, it is the LDMOS 3 that generates the electrical noise and it is the band-gap circuit that is influenced by the noise. However, the present invention may be applied to other semiconductor devices that have other combinations.

What is claimed is:

1. A semiconductor device, which includes a semiconductor substrate comprising:

a first area, which is located in a surface of the substrate and in which an electrical noise is generated;

a second area, which is located in the surface and to which the noise is transmitted;

a first isolating region, which is located around the first area;

a second isolating region, which is located around the first isolating region;

a third isolating region, which is located around the second area;

a third area, which is located between the second isolating region and the third isolating region;

a fourth area, which is located between the first and second isolating regions, wherein a potential of the fourth area is fixed;

a point of contact, which is located outside the substrate and has a predetermined potential;

a field ground area, which is located in the surface and electrically connected to the point of contact to fix the potential of the field ground area; and a first wiring line, which electrically connects the fourth area and the field ground area, wherein the first wiring line is electrically separated from the third area.

2. The semiconductor device in claim 1, further including:

a first contact region, which is located in a surface of the third area; and a second wiring line, which electrically connects the first contact region and the field ground area, wherein the first wiring line and the second wiring line are separately connected to the field ground area.

3. The semiconductor device in claim 1 including a second contact region, which includes a main contact region located in a surface of the fourth area and is electrically connected to the field ground area by the first wiring line.

4. The semiconductor device in claim 3, wherein the second contact region includes a supplementary contact region, which is in contact with the main contact region, for expanding the second contact region.

5. The semiconductor device in claim 4, wherein the main contact region is located in a surface of the supplementary contact region.

6. The semiconductor device in claim 4, wherein the supplementary contact region extends from the main contact region in the direction perpendicular to the surface of the substrate.

7. The semiconductor device in claim 4, wherein one of the first and second areas includes a doped region, which has substantially the same impurity concentration and substantially a same depth as those of the supplementary contact region, wherein the doped region and the supplementary contact region have been formed at the same step.

8. A semiconductor device, which includes a semiconductor substrate comprising:
   a first area, which is located in a surface of the substrate and in which an electrical noise is generated;
   a second area, which is located in the surface and to which the electrical noise is transmitted;
   a first isolating region, which is located around the first area;
   a second isolating region, which is located around the first isolating region;
   a third isolating region, which is located around the second area;
   a third area, which is located between the second isolating region and the third isolating region;
   a fourth area, which is located between the first and second isolating regions;
   a field ground area, which is located in the surface, wherein the field ground area is fixed at a predetermined potential when the device is used; and
   a first wiring line, which electrically connects the fourth area and the field ground area to fix the fourth area at the predetermined potential when the device is used, wherein the first wiring line is electrically separated from the third area.

9. The semiconductor device in claim 8, further comprising:
   a first contact region, which is located in a surface of the third area; and
   a second wiring line, which electrically connects the first contact region and the field ground area to fix the first contact region at the predetermined potential when the device is used.

10. The semiconductor device in claim 8, further comprising a second contact region, which includes a main contact region located in a surface of the fourth area and is electrically connected to the field ground area by the first wiring line.

11. The semiconductor device in claim 10, wherein the second contact region includes a supplementary contact region in contact with the main contact region, the supplementary contact region being for expanding the second contact region.

12. The semiconductor device in claim 11, wherein the main contact region is located in a surface of the supplementary contact region.

13. The semiconductor device in claim 11, wherein the supplementary contact region extends from the main contact region in a direction perpendicular to the surface of the substrate.

14. The semiconductor device in claim 11, wherein:
   one of the first and second areas includes a doped region having an impurity concentration and depth substantially identical to the impurity concentration and depth of the supplementary contact region; and
   the doped region and the supplementary contact region have been formed at a same step.

15. A semiconductor device, which includes a semiconductor substrate comprising:
   a first area located in a surface of the substrate and in which an electrical noise is generated;
   a second area located in the surface and to which the noise is transmitted;
   a first isolating region located around the first area;
   a second isolating region located around the first isolating region;
   a third isolating region located around the second area;
   a third area located between the second isolating region and the third isolating region;
   a fourth area located between the first and second isolating regions;
   a field ground area located in the surface, wherein the field ground area is fixed at a predetermined potential when the device is used;
   a first wiring line for electrically connecting the fourth area and the field ground area to fix the fourth area at the predetermined potential when the device is used, wherein the first wiring line is electrically separated from the third area;
   a first contact region located in a surface of the third area; and
   a second wiring line for electrically connecting the first contact region and the field ground area to fix the first contact region at the predetermined potential when the device is used.

16. The semiconductor device in claim 15, further comprising a second contact region, wherein the second contact region includes a main contact region located in a surface of the fourth area and is electrically connected to the field ground area by the first wiring line.

17. The semiconductor device in claim 16, wherein the second contact region includes a supplementary contact region, which is in contact with the main contact region, for expanding the second contact region.

18. The semiconductor device in claim 17, wherein the main contact region is located in a surface of the supplementary contact region.

19. The semiconductor device in claim 17, wherein the supplementary contact region extends from the main contact region in a direction perpendicular to the surface of the substrate.

20. The semiconductor device in claim 17, wherein:
   one of the first and second areas includes a doped region, which has substantially the same impurity concentration and substantially the same depth as those of the supplementary contact region; and
   the doped region and the supplementary contact region have been formed at a same step.

* * * * *